US006298943B1

(12) United States Patent
Yamada et al.

(10) Patent No.: US 6,298,943 B1
(45) Date of Patent: Oct. 9, 2001

(54) BASS-REFLEX SPEAKER ASSEMBLY

(75) Inventors: Katsuhisa Yamada; Yoji Kanaoka; Koichi Shimamura; Takehiro Nonaka, all of Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/443,736

(22) Filed: Dec. 1, 1999

(30) Foreign Application Priority Data

Dec. 1, 1998 (JP) ..... 10-341917
Nov. 4, 1999 (JP) ..... 11-313555

(51) Int. Cl.[7] ..... H05K 5/00

(52) U.S. Cl. ..... 181/156; 181/149; 181/160; 181/199; 296/78.1; 280/288.4

(58) Field of Search ..... 181/141, 149, 181/150, 153, 155, 156, 160, 199, 0.5, 211; 296/781; 280/288.4

(56) References Cited

U.S. PATENT DOCUMENTS 3,828,887 * 8/1974 Alexander ..... 181/126
4,473,251 * 9/1984 Murayama ..... 269/78.1
5,012,889 * 5/1991 Rodgers ..... 181/152
5,109,942 * 5/1992 Akimori et al. ..... 180/219
5,197,103 * 3/1993 Hayakawa ..... 381/159
5,471,019 * 11/1995 Maire ..... 181/156
5,821,471 * 10/1998 McCuller ..... 181/156

FOREIGN PATENT DOCUMENTS 61-154092 U 9/1986 (JP) .
63-211899 9/1988 (JP) .

* cited by examiner

*Primary Examiner*—Robert E. Nappi
*Assistant Examiner*—Edgardo San Martin
(74) *Attorney, Agent, or Firm*—Birch, Stewart, Kolasch & Birch, LLP

(57) ABSTRACT

To provide a bass-reflex speaker assembly having superior water resistance and which can be mounted on a motorcycle, while not being subjected to the influence of negative pressure due to wind during travel and which is capable of maintaining superior sound quality. A resonant duct projects downwards at an incline at a bottom surface of a speaker enclosure. It is therefore difficult for rain water to enter because the duct opens downwards and water that may enter temporarily can be easily discharged from the same duct. Furthermore, when speakers are positioned within the cowling of the motorcycle, negative pressure occurring due to wind when the vehicle is travelling acts not only on the front surfaces of paper cones of the speakers, but also on the rear surfaces via the ducts. Therefore, superior sound quality can be maintained without the influence of negative pressure being incurred and a bass-reflex speaker assembly suited to motorcycles is therefore possible.

17 Claims, 6 Drawing Sheets

BASS-REFLEX SPEAKER ASSEMBLY

BACKGROUND OF THE INVENTION

1. Field of the Invention

The present invention relates to a bass-reflex speaker, and more particularly relates to a bass-reflex speaker assembly that can be implemented in two-wheeled vehicles etc., vehicles that are used outdoors, and in other equipment.

2. Description of Related Art

Audio speaker systems where the phase of sound from a rear surface is inverted and the sound is outputted from a front surface are well known. This kind of speaker utilizes an acoustic effect where low-pitched sound resonates due to a hole formed at the front surface of a sealed speaker box and is referred to as a bass-reflex speaker. The resonant frequency is then determined by the size of the hole (port) and the length of a tube (resonant duct) attached to the port.

Ducts that project towards the outside of an enclosure (as in, for example, Utility Model Laid-open Publication No. Sho. 61-154092) are well known. Ducts that face towards the inside of an enclosure are suited to reproduction of low-pitched sounds, with resonant sound reflected at the rear surface of the enclosure being extracted from the duct. Ducts facing the outside function as a wall to prevent interference of high and low-pitched sound and are used to change frequency characteristics as a result of where such ducts are installed.

FIG. 8 is a view showing a duct that faces the inside of an enclosure and FIG. 9 is a cross-sectional view of a duct that projects outwards from the enclosure. In both drawings, a speaker 32 is attached to a panel 31 of the enclosure, and a duct 33 is positioned below the speaker 32. When a speaker system having this kind of configuration is mounted on a two-wheeled vehicle, etc., there are cases where water enters into the enclosure 30 from the duct 33 as a result of washing the vehicle or because of rain. Since water W temporarily entering the enclosure 30 accumulates at the bottom of the enclosure 30, it has, in reality, been difficult to adopt such a speaker system in a two-wheeled vehicle.

Attention should be paid to the following when audio speakers are mounted on a two-wheeled vehicle having a cowling. When the vehicle is in motion the inside of the cowling is at negative pressure and air pressure differences occur at the paper cones of the speakers, i.e., at both sides of a diaphragm. The paper cones therefore deviate towards the rider side and the sound quality deteriorates. Having a bias current corresponding to the air pressure difference flow through the voice coil has been considered in order to resolve this problem (for example, Japanese Patent Laid-open No. Sho. 63-211899). However, the method for providing a bias current makes the system more complex, and a simpler method is therefore preferred.

SUMMARY OF THE INVENTION

It is therefore an object of the present invention to provide a bass-reflex speaker system that resolves the aforementioned problems, that prevents water from leaking in and makes discharge of water straightforward when water has leaked in, that is appropriate for preventing deterioration of sound quality, and which can be installed in equipment used outdoors on two-wheeled vehicles, etc.

In order to achieve the aforementioned object, in a first feature of the of the present invention, there is provided an enclosure housing a speaker and defining an acoustic space and a resonant duct positioned at the front surface of the speaker at the lowermost end of the enclosure, wherein the resonant duct has an opening set in a designated direction within a range from a horizontal direction to a vertically downward direction at the front of the speaker. In addition to the first feature, in a second feature of the present invention, there is provided a speaker box covering the enclosure, the speaker box having a recessed surface formed at the front surface thereof so as to be inclined towards the rear, and the resonant duct protruding outwards from the recessed surface. Further, in a third feature of the present invention, the speaker box is formed of part of a motorcycle panel formed so as to cover the enclosure.

According to the first to third features, water that enters to within the enclosure is discharged to outside of the enclosure through the resonant duct which is provided improve the acoustic effect. In particular, according to the second feature, it is difficult for water falling from above, such as rain, etc., to enter the enclosure. According to the third feature, at the speaker box formed integrally with the panel of the motorcycle, water is prevented from entering to within the enclosure and discharge of water that does enter is possible.

In a fourth feature of the present invention, there is provided a bass-reflex speaker assembly mounted on a motorcycle having a front cowling, comprising: an enclosure, provided at a space covered by the front cowling, housing a speaker and defining an acoustic space and a resonant duct positioned at the front surface of the speaker at the lowermost end of the enclosure, wherein the resonant duct has an opening set in a designated direction within a range from a horizontal direction to a vertically downward direction at the front of the speaker.

In a fifth feature of the present invention, there is provided an air scoop having an air capturing opening, and a wind discharging outlet for discharging captured air to the rider, provided at the front of the vehicle. Furthermore, a louver is positioned facing the air scoop wind discharging outlet, with the resonant duct opening in a downward direction so as to point to between the wind discharging outlet and the louver.

According to the fourth and fifth features, when the inside of the cowling is at negative pressure due to wind while travelling, the inside of the enclosure also experiences a negative pressure via the resonant duct. Therefore, an air pressure difference does not occur at the front and back of the diaphragm of the speaker assembly installed within the cowling.

According to the fifth feature, the resonant duct points downwards and is hidden behind the louver. It is therefore not necessary to make space for positioning the resonant duct on the motorcycle panel, complicating the external appearance can be avoided and work can be carried out via the louver during maintenance.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 3:
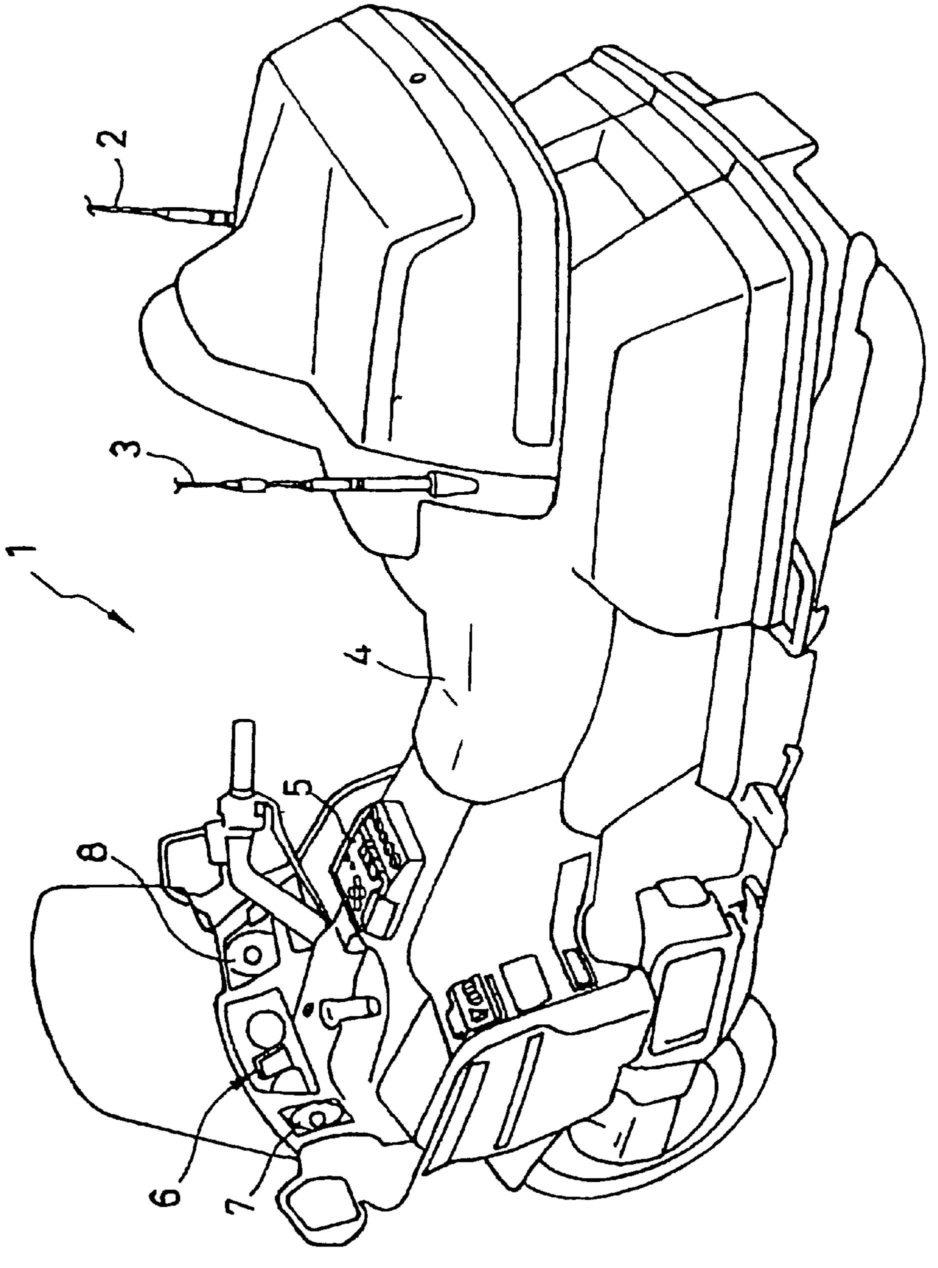
FIG. 3 is a perspective view of the appearance of a motorcycle on which a speaker system of the first embodiment of the present invention is mounted.

The following is a description of the present invention with reference to the drawings. FIG. 3 is a perspective view showing the outline of a motorcycle into which the bass-reflex speaker assembly of an embodiment of the present invention is incorporated. In FIG. 3, a radio antenna 2 and CB receiver antenna 3 are provided on the rear of a motorcycle 1 and an audio unit 5 is provided at a front of the seat 4. A liquid crystal display device 6 for displaying a speedometer and rev counter and other displays is provided at a central panel at the front of the motorcycle 1. A pair of speaker systems 7 and 8 are provided to the left and right of the liquid crystal display device 6. Signals received by the antennas 2 and 3 and audio data read from a cassette tape, etc. are regulated at the audio unit 5 and outputted as sound from the speaker systems 7 and 8.

Figure 1:
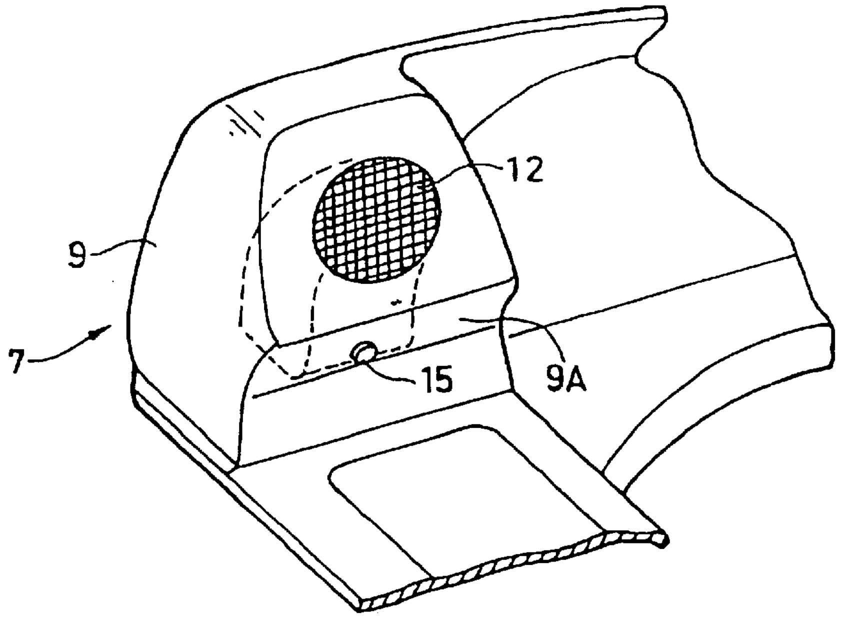
FIG. 1 is a perspective view of a speaker system of a first embodiment of the present invention.
Figure 2:
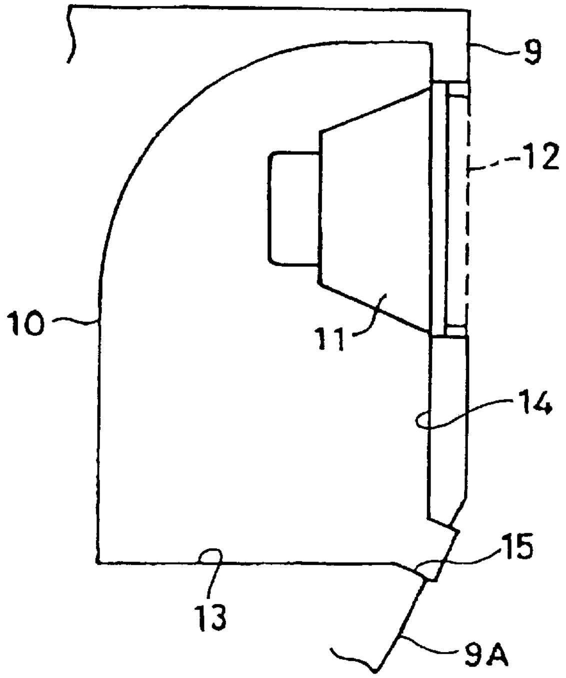
FIG. 2 is a vertical cross-sectional view of a speaker system of the first embodiment of the present invention.

The details of the speaker systems 7 and 8 will now be described. Since the speaker systems 7 and 8 have the same configuration, a description of the speaker system 7 will be given as being typical in the following description. FIG. 1 is an outer perspective view of the speaker 7 installed on the motorcycle, and FIG. 2 is a cut-away view of the speaker system 7. In both drawings the speaker system 7 is covered by a speaker box 9, so that an acoustic space is formed encompassed by the enclosure 10. The speaker box 9 is formed of part of a panel covering the motorcycle. A speaker 11 is attached to the upper part of the inner surface of the front surface of the enclosure 10 and a hole is formed at the enclosure 10 and the speaker box 9 in a manner compatible with the shape of the front surface of the speaker 11, with a net 12 spanning the hole in the speaker box 9.

A resonant duct, i.e., a bass-reflex duct 15, extending to the outside of the enclosure 10 is formed in the enclosure 10 at a cross point of a bottom surface 13 and a front surface 14. The side of the speaker system from which sound is principally emitted is taken to be the front, and the direction towards the interior of the speaker system is taken to be the rear. The speaker box 9 has an inclined surface (recessed surface) 9A facing towards the rear at its front surface, i.e., at the lower part of the surface across which the net 12 spans. The bass-reflex duct 15 that extends forwards from the bottom surface 13 of the enclosure 10 projects outwards from the recessed surface 9A.

As can be understood from FIG. 1 and FIG. 2, the bass-reflex duct 15 formed in the enclosure 10 is formed so as to incline downwards at the recessed surface 9A and it is therefore difficult for water falling from above to enter the enclosure 10. Furthermore, the duct 15 is provided at the bottom surface 13 of the enclosure 10, i.e., at the lowermost part so that even if water does leak in, such water is discharged immediately from the duct 15 and water therefore does not accumulate at the bottom of the enclosure 10.

In this embodiment, the duct 15 projects from the recessed surface 9A, but does not have to project from this kind of recessed surface. The duct 15 can also project in a perpendicular plane perpendicular to the enclosure, i.e., from the front surface. Furthermore, it is preferable for the duct 15 to be inclined downwards from the point of view of preventing leaking in of water, but it is sufficient for the lower inner surface of the duct 15 to be positioned at the same horizontal level as the bottom surface 13.

Figure 4:
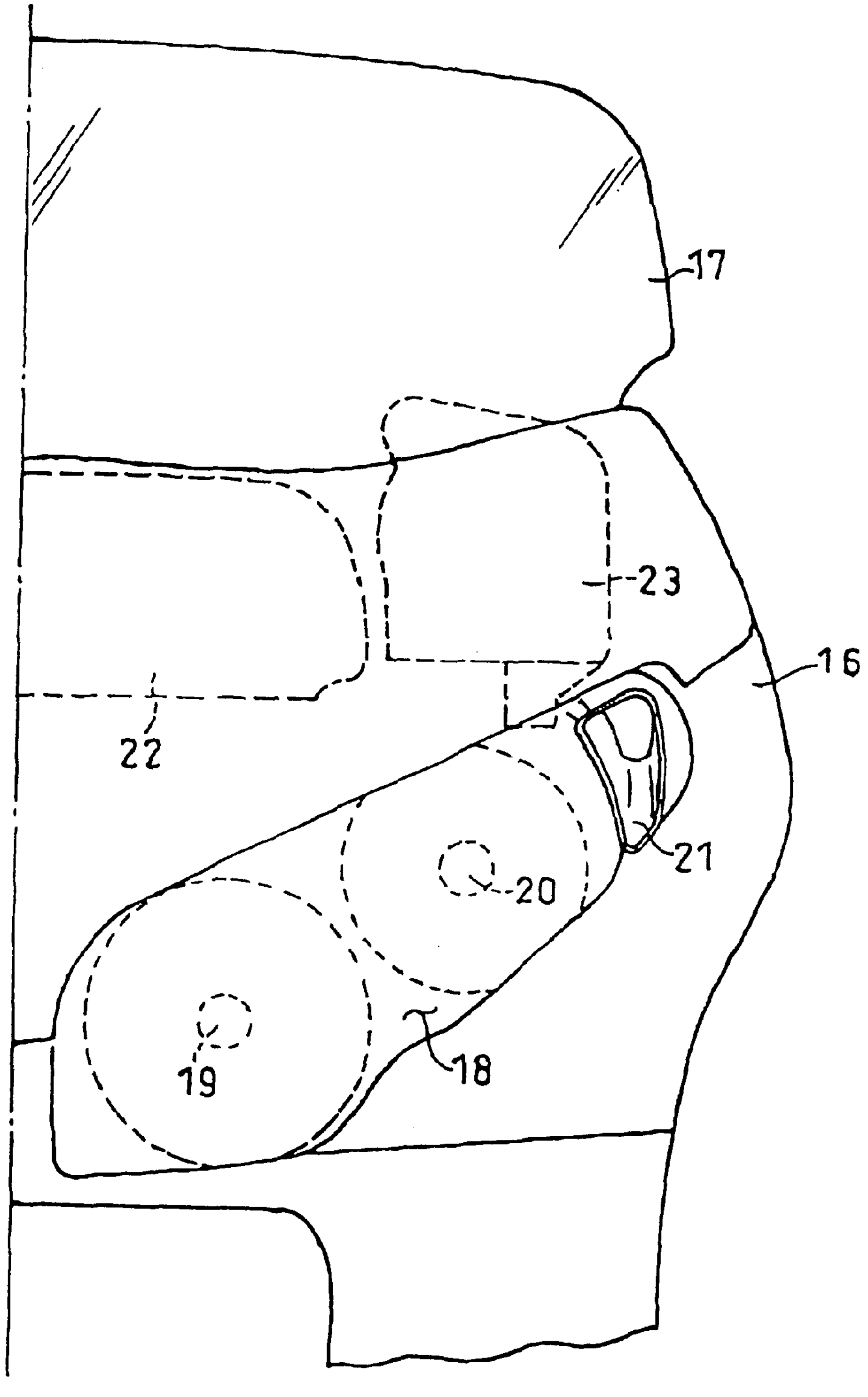
FIG. 4 is a front view of the essential parts of the motorcycle mounted with the speaker system of a second embodiment.

FIG. 4 is a front view of the essential parts of a motorcycle mounted with a speaker system of a second embodiment of the present invention and shows the left half portion of the motorcycle. In FIG. 4, the front part of the vehicle is covered by a front cowling 16 and a windshield 17 attached to the upper part of the front cowling 16. Headlights 19 and 20 with front surfaces covered by a lens surface 18 are housed at the front cowling 16. An intake duct (air scoop) 21 for taking in air at the rider's side is positioned next to the headlight 20, with the air scoop 21 opening towards the front of the front cowling 16 next to an end of the lens surface 18. A meter box 22 is provided above the headlight 19 and an enclosure 23 for the speaker system is provided above the headlight 20.

Figure 5:
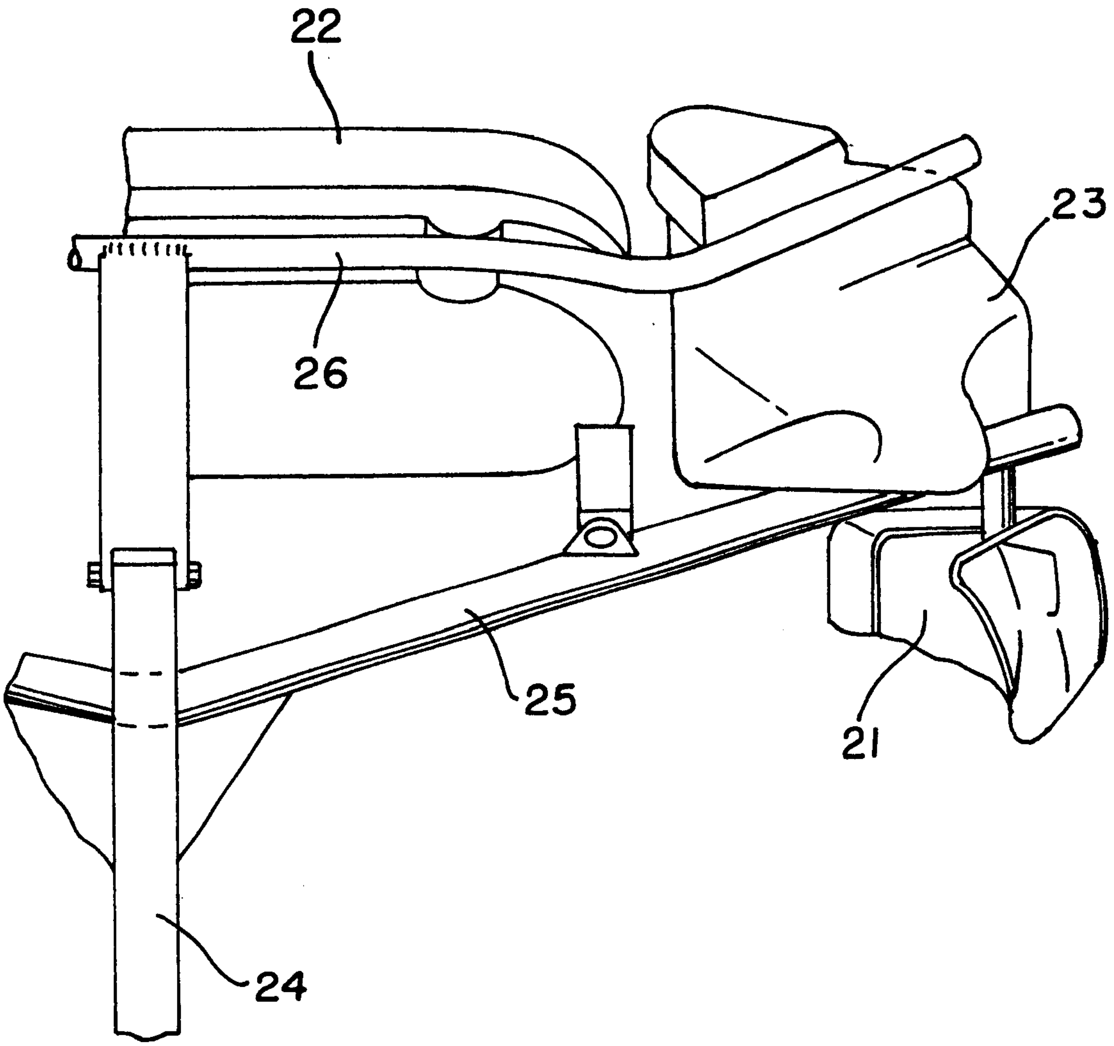
FIG. 5 is a front view of the essential parts of the motorcycle with the cowling removed.

FIG. 5 is a front view of the essential parts of a motorcycle with the front cowling removed. In FIG. 5, a stay 25 and a stay 26 jutting in a substantially horizontal manner are fixed at a support post 24 attached at a steering head (not shown). The air scoop 21 is suspended from the end of the stay 25. The meter box 22 is supported at the stay 26 and the lower part of the meter box 22 is coupled to the stay 25. The speaker system enclosure 23 is positioned between the stay 25 and the stay 26 and is fixed to the stay 25 and the stay 26 by appropriate means.

Figure 6:
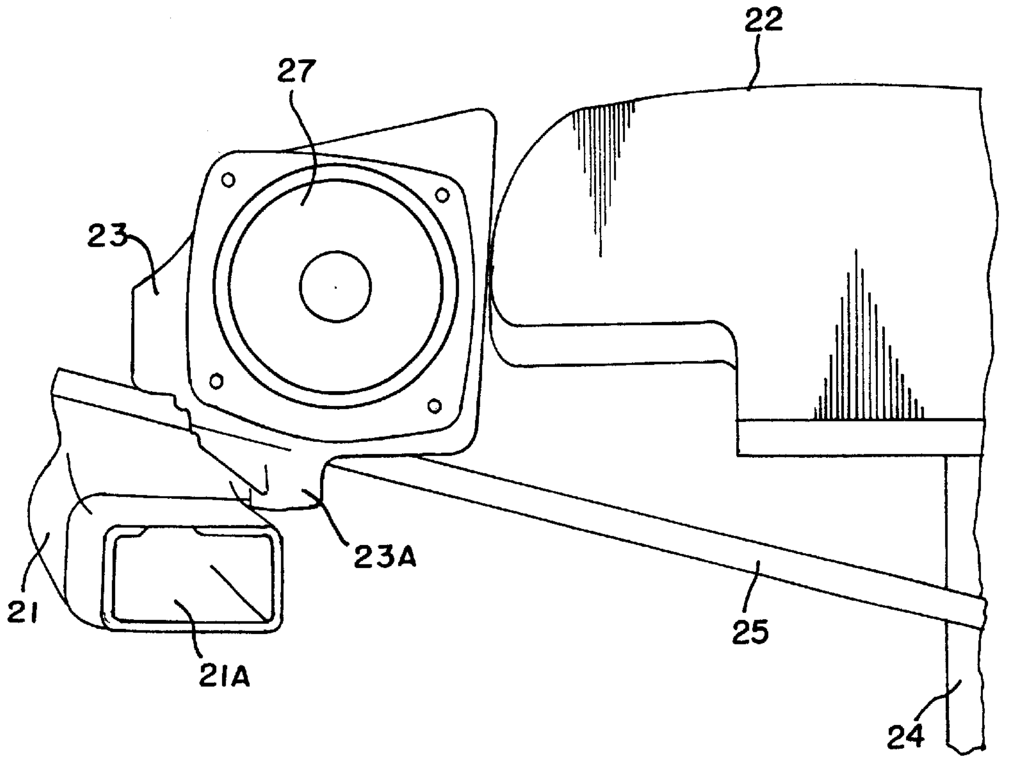
FIG. 6 is a front view of the essential parts of the speaker system as viewed by the rider.
Figure 7:
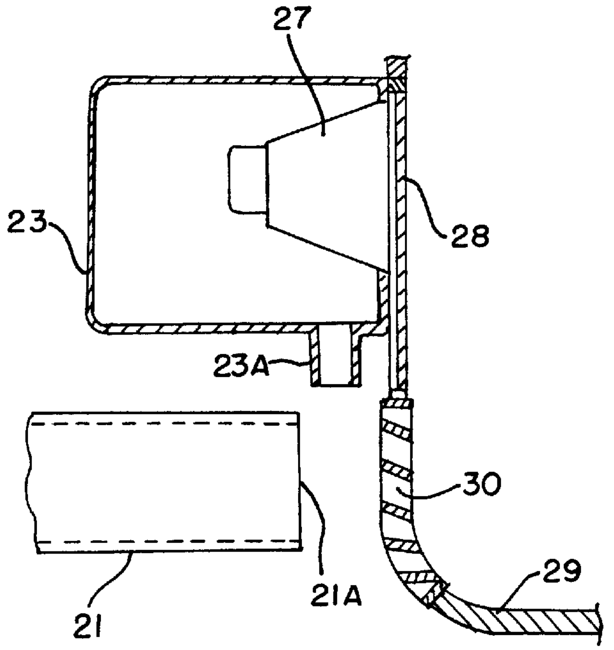
FIG. 7 is a cross-sectional side view of the speaker system.
Figure 8:
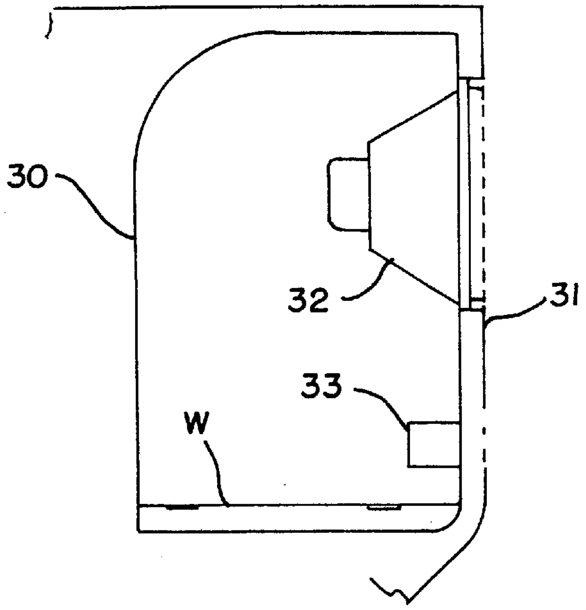
FIG. 8 BACKGROUND ART
FIG. 8 is a cross-sectional view of a related art bass-reflex speaker assembly (first of two)
Figure 9:
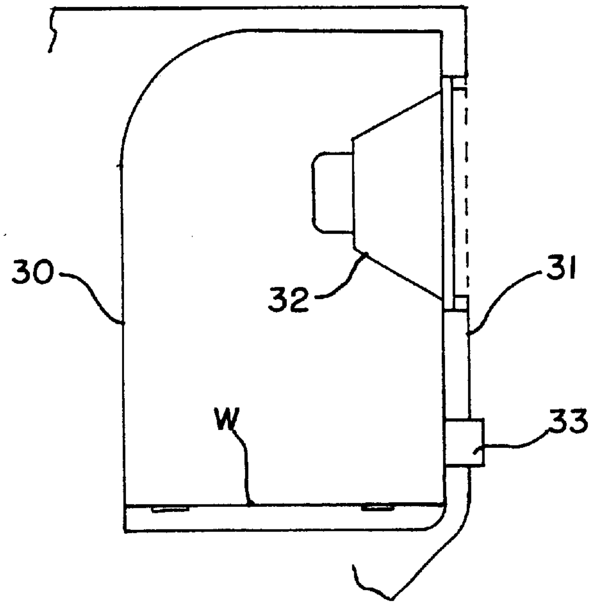
FIG. 9 BACKGROUND ART
FIG. 9 is a cross-sectional view of a related art bass-reflex speaker assembly (second of two).

FIG. 6 is a view of the rear of FIG. 5, i.e., a front view of the essential parts of the speaker system, and FIG. 7 is a side cross-section of the same. In FIG. 7, a panel 28 for protecting the speakers 27 and to improve the appearance is arranged at the front surface of the speaker 27. This panel 28 comprises a resin or metal plate having a multiplicity of holes and is formed integrally with a panel (instrument panel) arranged at the front surface of the meter box 22.

A second panel 29 connected to the lower part of the panel 28 is provided and a louver 30 fitting with a wind discharging outlet 21A of the air scoop 21 is provided at the second panel 29. A bass-reflex duct 23A is formed at the bottom part of the enclosure 23. This bass-reflex duct 23A projects downwards from the enclosure 23 and opens in a direction facing between the wind discharging outlet 21A of the air scoop 21 and the louver 30.

In addition to preventing water from accumulating within the enclosure 23 as with the bass-reflex duct 15 described for FIG. 1, the bass-reflex duct 23A of the second embodiment can provide a superior audio effect, even when sufficient space cannot be guaranteed on the instrument panel, by forming the bass-reflex duct 23A so as to face downwards from the bottom surface of the enclosure 23. Even when the bass-reflex duct 23A points downwards, the sound outputted from the bass reflex duct 23A is a low pitch sound of low directivity and therefore there is no detrimental effect on the transmission of sound to the rider. Low pitch sound can therefore easily be transmitted to the rider because the bass-reflex duct 23A is installed in the vicinity of the wind discharging outlet 21A.

Differences in air pressure occurring at the front and back of the diaphragm of the speaker 27 due to wind when travelling can therefore be removed because the bass-reflex duct 23A opens within the cowling. Therefore, deterioration of sound quality can be prevented.

In the above embodiments, examples are given where the bass-reflex duct opens towards the front or vertically downwards, but the present invention is by no means limited to this embodiment. The opening direction of the bass-reflex duct can be modified in various manners and can be set to any designated direction in a range from horizontal to vertically downwards at the lowermost part of the enclosure so as to open towards the front surface of the speaker, provided that the sound can be easily transmitted to the rider, it is difficult for water to enter, and water that may enter temporarily can be easily discharged.

As is clear from the above description, according to the present invention, it becomes difficult for falling water to enter into the enclosure at the speaker box, and water that temporarily leaks in can be easily discharged from the duct. Bass-reflex speaker assemblies can therefore also be mounted for equipment used with vehicles such as motorcycles that are often used in the rain and music containing a wide range of low to intermediate frequencies can be enjoyed as a result of the bass-reflex effect. Furthermore, there is no influence incurred due to negative pressure caused by wind during travel when a speaker assembly is mounted within the cowling of a motorcycle. Therefore, superior sound quality can be maintained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bass-reflex speaker assembly comprising:

an enclosure defining an acoustic space;

a speaker mounted within said enclosure; and a resonant duct positioned at a front surface of said speaker at a lowermost end of said enclosure, said resonant duct including a first end having an opening located at an intersection of a front and bottom wall of said enclosure, and a second end located at a spaced location from said enclosure.

2. The bass-reflex speaker assembly of claim 1, further comprising a speaker box for covering the enclosure, said speaker box having a recessed surface formed at a front surface thereof, said recessed surface being inclined in a direction towards a rear of the enclosure, and said resonant duct passes through and extends outwards from the recessed surface.

3. The bass-reflex speaker assembly of claim 2, wherein said speaker box is formed of part of a motorcycle panel.

4. The bass-reflex speaker assembly of claim 1, further comprising a speaker box formed of part of a motorcycle panel, said speaker box covering the enclosure, said enclosure being a separate element from said speaker box.

5. The bass-reflex speaker assembly of claim 1, wherein said resonant duct opens at said second end at an acute angle with respect to the front surface of the speaker.

6. A motorcycle having a bass-reflex speaker assembly, comprising:

a front cowling;

an enclosure defining an acoustic space, said enclosure being provided within a space covered by said front cowling, said enclosure being a separate element from said front cowling;

a speaker mounted within said enclosure; and a resonant duct positioned at a front surface of said speaker at a lowermost end of said enclosure, said resonant duct including a first end having an opening located at an intersection of a front and bottom wall of said enclosure, and a second end located at a spaced location from said enclosure.

7. The motorcycle of claim 6, further comprising:

an air scoop having an air capturing opening and a wind discharging outlet for discharging captured air to the rider, said air scoop being provided at a front of the motorcycle; and a louver positioned facing the air scoop wind discharging outlet, wherein said second end of said resonant duct opens in a downward direction between said wind discharging outlet and said louver.

8. The motorcycle of claim 7, further comprising:

a first panel for covering a front surface of the speaker;

a second panel connected to a lower part of the first panel; and said louver is connected between said first and second panels at a location in front of said air scoop wind discharging outlet.

9. The bass-reflex speaker assembly of claim 1, wherein said resonant duct opens at said second end in a horizontal direction.

10. The bass-reflex speaker assembly of claim 1, wherein said resonant duct opens at said second end in a vertical direction.

11. The bass-reflex speaker assembly of claim 4, wherein said resonant duct extends away from said enclosure and through said speaker box.

12. The motorcycle of claim 7, wherein a space is formed between said wind discharging outlet and said louver, and said second end of said resonant duct opens into said space.

13. The motorcycle of claim 6, further comprising:

a support post extending in a generally vertical manner;

a pair of stays mounted to and extending generally horizontally from said support post; and said enclosure is fixed between said pair of stays.

14. The motorcycle of claim 13, further comprising a meter box, said meter box being supported by a first of said pair of stays and coupled to a second of said pair of stays.

15. The motorcycle of claim 7, further comprising:

a support post extending in a generally vertical manner;

a pair of stays mounted to and extending generally horizontally from said support post; and said enclosure is fixed between said pair of stays.

16. The motorcycle of claim 15, further comprising a meter box, said meter box being supported by a first of said pair of stays and coupled to a second of said pair of stays.

17. The motorcycle of claim 16, wherein said air scoop is mounted to said second of said pair of stays.

* * * * *